United States Patent
Milo et al.

(10) Patent No.: US 11,239,130 B2
(45) Date of Patent: Feb. 1, 2022

(54) SELECTIVE MOLDING FOR INTEGRATED CIRCUIT

(71) Applicant: Texas Instruments Incorporated, Dallas, TX (US)

(72) Inventors: Dolores Babaran Milo, Baguio (PH); Floro Lopez Camenforte, III, Mabalacat (PH); Joe Anne Feive Carbonell Lopez, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/597,915

(22) Filed: Oct. 10, 2019

(65) Prior Publication Data

US 2021/0111086 A1      Apr. 15, 2021

(51) Int. Cl.
*H01L 23/31* (2006.01)
*H01L 23/00* (2006.01)
(Continued)

(52) U.S. Cl.
CPC ........ *H01L 23/3157* (2013.01); *H01L 21/561* (2013.01); *H01L 21/565* (2013.01);
(Continued)

(58) Field of Classification Search
CPC ............... H01L 23/3157; H01L 23/562; H01L 23/49575; H01L 24/46; H01L 21/561; H01L 24/85; H01L 24/96; H01L 21/565; H01L 2924/565; H01L 23/31; H01L 23/00; H01L 23/495; H01L 21/56; H01L 25/00; H01L 25/50; H01L 23/3135; H01L 24/73; H01L 24/83; H01L 23/3107; H01L 24/45; H01L 24/32; H01L 23/49548; H01L 24/92; H01L 24/29; H01L 24/48; H01L 25/16; H01L 24/97; H01L 924/35;
(Continued)

(56) References Cited

U.S. PATENT DOCUMENTS 5,173,766 A * 12/1992 Long ....................... H01L 21/50
                                                  257/687
5,904,497 A * 5/1999 Akram ..................... H01L 23/16
                                                  438/106

(Continued)

OTHER PUBLICATIONS

Henkel, "TDS Loctite Eccobond 50300 HT," Technical datasheet, Aug. 2014, 2 pages.
(Continued)

*Primary Examiner* — Alexander O Williams
(74) *Attorney, Agent, or Firm* — Ronald O. Neerings; Charles A. Brill; Frank D. Cimino

(57) ABSTRACT

A method includes performing a first molding process to enclose a portion of a first semiconductor die in a first package structure with an opening that exposes a portion of a second semiconductor die mounted to the first semiconductor die, as well as performing a deposition process to deposit a stress absorbing material in the opening of the first package structure to cover the portion of the second semiconductor die, and performing a second molding process to enclose a portion of the stress absorbing structure in a second package structure that extends on a side of the first package structure.

23 Claims, 14 Drawing Sheets

(51) Int. Cl.
  *H01L 23/495* (2006.01)
  *H01L 21/56* (2006.01)
  *H01L 25/00* (2006.01)

(52) U.S. Cl.
  CPC ...... *H01L 23/49575* (2013.01); *H01L 23/562* (2013.01); *H01L 24/46* (2013.01); *H01L 24/85* (2013.01); *H01L 24/96* (2013.01); *H01L 25/50* (2013.01); *H01L 2924/35* (2013.01)

(58) Field of Classification Search
  CPC . H01L 2224/92247; H01L 2224/73265; H01L 2224/4847; H01L 2224/48145; H01L 2224/32245; H01L 2924/181; H01L 2224/48091; H01L 2224/32145; H01L 2224/45015; H01L 2224/45147; H01L 2224/48463; H01L 2224/45144; H01L 2224/48247; H01L 2224/8385; H01L 2224/45565; H01L 2224/45664; H01L 2224/2919; H01L 2924/00014; H01L 2924/00012; H01L 2924/45015; H01L 2924/20752; H01L 2924/20753; H01L 2924/20754; H01L 2924/20755; H01L 2924/0665

USPC .......................................... 257/787, 788, 789
  See application file for complete search history.

(56) References Cited

U.S. PATENT DOCUMENTS

| | | |
|---|---|---|
| 9,761,536 B1 | 9/2017 | Milo et al. |
| 2010/0140763 A1* | 6/2010 | Camacho .......... H01L 23/49503 257/676 |
| 2017/0278776 A1 | 9/2017 | Milo et al. |
| 2017/0330841 A1* | 11/2017 | Cook ...................... H01L 24/48 |
| 2018/0047685 A1* | 2/2018 | Spory ................... H01L 23/057 |
| 2018/0182642 A1 | 6/2018 | Milo et al. |
| 2019/0051585 A1* | 2/2019 | Dimaano, Jr. ...... H01L 23/3121 |
| 2019/0207582 A1* | 7/2019 | Wainerdi .......... H01L 23/49513 |
| 2020/0357715 A1* | 11/2020 | Vincent ................ H01L 23/295 |

OTHER PUBLICATIONS

Henkel, "Eccobond 50300 LV," Technical Data Sheet, Feb. 2012, 2 pages.
Henkel, "TDS Eccobond 50500-1 Formerly Stycast 50500-1," Jun. 2012, 2 pages.

* cited by examiner

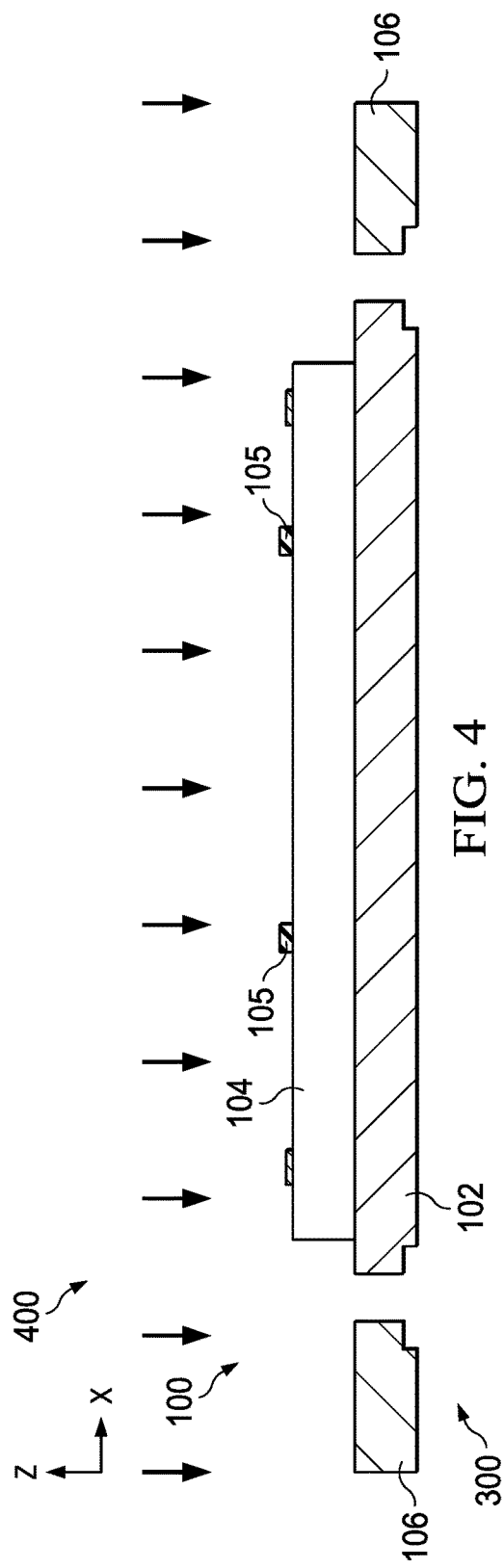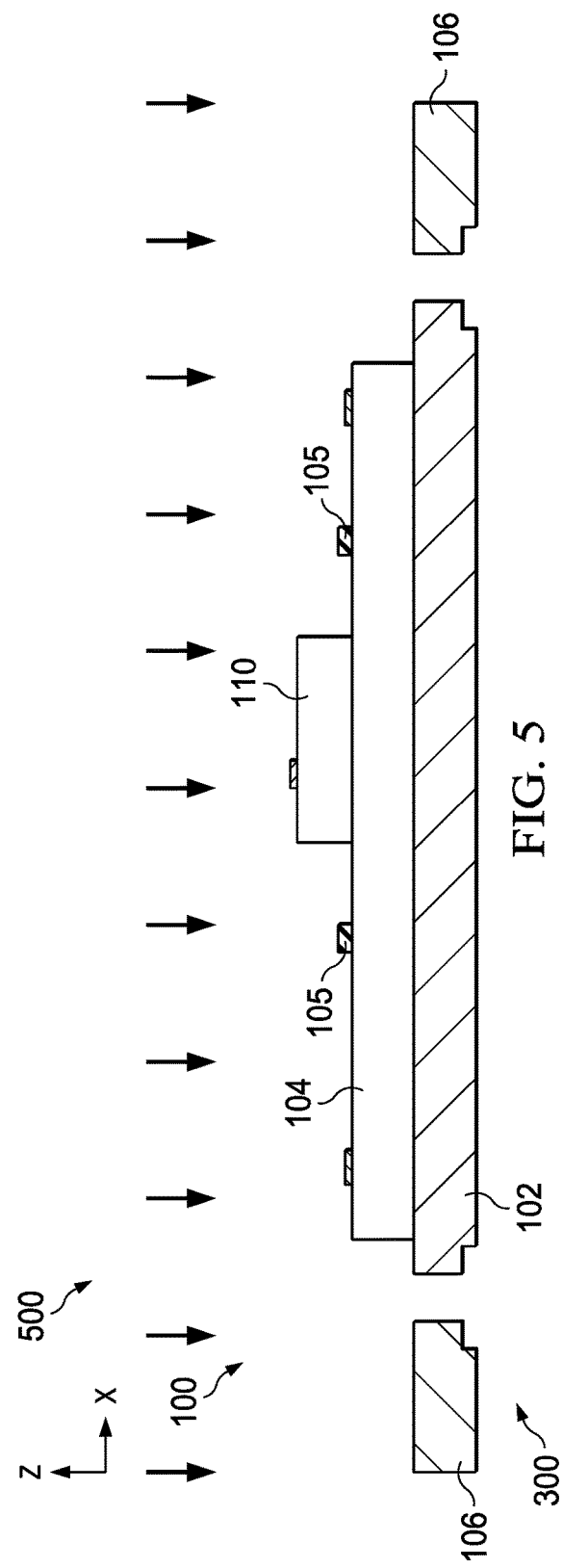

SELECTIVE MOLDING FOR INTEGRATED CIRCUIT

BACKGROUND

Many packaged electronic devices include a die with one or more electronic components mounted to a die pad or die attach pad (DAP) within a molded package structure. Bond wires connect die pads of the die with leads that provide external access for soldering to a host printed circuit board (PCB). Glob top materials are used to cover and protect dies or other components of an integrated circuit against contamination, mechanical stress, etc. However, glob top material can move or bleed out of a designed area during a cure process, leading to undesired delamination of molding material from a semiconductor die. Also, outgassing of glob top material can cause reaction with a semiconductor die or a lead frame surface. Glob top material bleed out and outgassing effects can impact bond wire connection or stitch integrity, for example, corroded stitches, lifted stitches, short tail problems, etc. A boundary material layer, such as a ring of polyimide can be formed on the die surface to mitigate glob top bleed out, but controlled deposition within the boundary layer is difficult. Multiple concentric rings can be formed, but this increases production cost and complexity. The processing time for deposition and curing of the glob top material can be precisely controlled to attempt to mitigate material bleed out, for example, using fast partial curing to stop material movement, followed by a full glob top cure. However, these process changes increase production cost, complexity and time, particularly for batch processing of multiple products in panels.

SUMMARY

An electronic device includes a die attach pad, first and second semiconductor dies, a glob top or other stress absorbing structure, and first and second package structures. The first semiconductor die in one example has a first side mounted to the die attach pad, and a second side with conductive bond pads. The device includes a bond wire connected between a bond pad of the first semiconductor die and a lead that is spaced apart from the die attach pad. The second semiconductor die has a first side mounted to the second side of the first semiconductor die, and a second side with a conductive bond pad. A second bond wire is connected between bond pads of the first and second semiconductor dies. The stress absorbing structure, such as an epoxy material, extends on the second semiconductor die and on a portion of the second side of the first semiconductor die. The first package structure extends on portions of the die attach pad, the lead, and the first semiconductor die, and the first package structure extends around at least a first portion of the stress absorbing structure. In one example, a portion of a surface of the second portion of the stress absorbing structure is spaced apart from the second package structure. The second package structure that encloses a second portion of the stress absorbing structure and extends on a first side of the first package structure to form a join line along an outer surface of the electronic device at an interface between the first and second package structures. In one example, the first and second package structures are or include a molded compound material. One example also includes a polyimide layer that extends on the second side of the first semiconductor die, spaced apart from and encircling the second semiconductor die.

A method is provided, which includes attaching a first side of a first semiconductor die to a die attach pad of a lead frame and attaching a second semiconductor die to a second side of the first semiconductor die. The method also includes connecting a first bond wire between a first conductive bond pad of the first semiconductor die to a lead of the lead frame, and connecting a second bond wire between a second conductive bond pad of the first semiconductor die and a conductive bond pad of the second semiconductor die. In addition, the method includes enclosing a portion of the die attach pad, a portion of the first semiconductor die, a portion of the lead, and the first bond wire in a first package structure with an opening that exposes a portion of the second semiconductor die. The method further includes depositing a stress absorbing material in the opening of the first package structure to cover the portion of the second semiconductor die, for example by jet printing. The method also includes enclosing a portion of the stress absorbing structure in a second package structure that extends on a side of the first package structure. In one example, the method also includes curing the stress absorbing material in the opening of the first package structure after depositing the stress absorbing material and before forming the second package structure. In one example, the method includes forming a polyimide layer on the second side of the first semiconductor die. The method in one example also includes performing a singulation process that separates packaged electronic devices from one another after performing the second molding process, In another aspect, a method is provided for fabricating a stress absorbing glob top structure in an electronic device. The method includes performing a first molding process that encloses a portion of a first semiconductor die in a first package structure with an opening that exposes a portion of a second semiconductor die that is mounted to the first semiconductor die, and performing a deposition process that deposits a stress absorbing material in the opening of the first package structure to cover the portion of the second semiconductor die. The method also includes performing a second molding process that encloses a portion of the stress absorbing structure in a second package structure that extends on a side of the first package structure.

BRIEF DESCRIPTION OF THE DRAWINGS

FIG. 4 is a partial sectional side elevation view of the lead frame of FIG. 3 undergoing a first die attach process.

FIG. 5 is a partial sectional side elevation view of the lead frame of FIGS. 3 and 4 undergoing a second die attach process.

DETAILED DESCRIPTION

Figure 1:
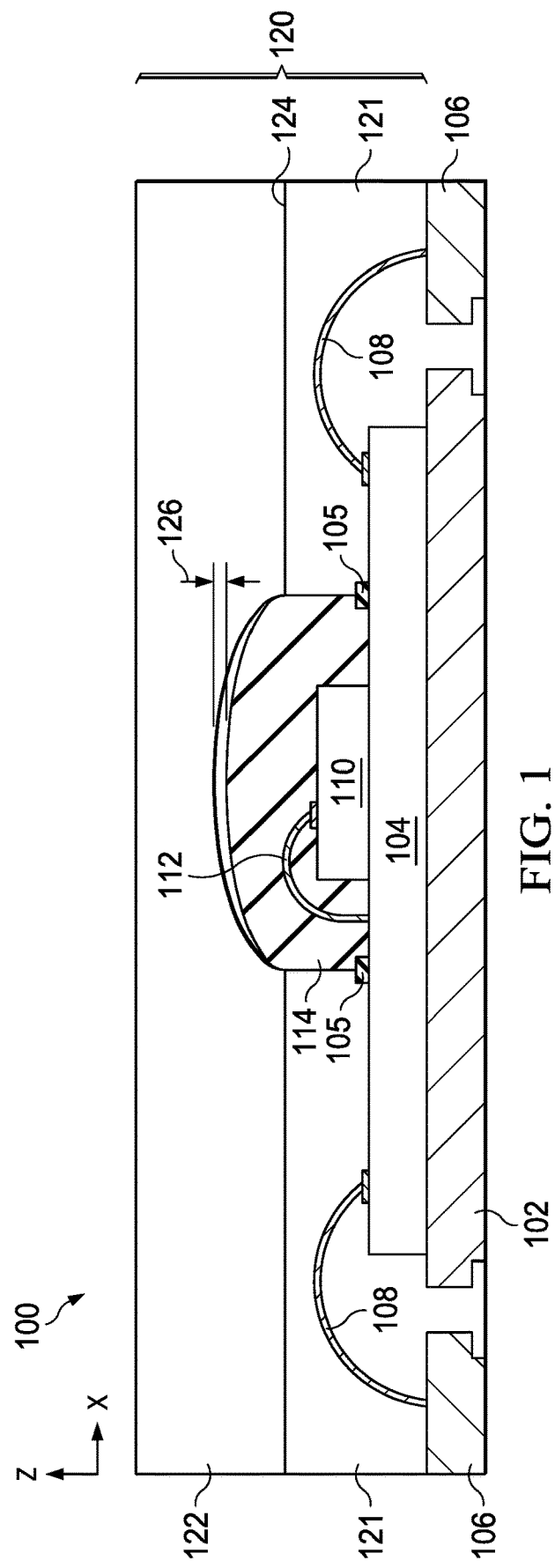
FIG. 1 is a sectional side elevation view of a package electronic device with first and second molded package structures and an internal glob top material partially delaminated from a surface of the upper second package structure according to one embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a packaged electronic device 100, such as an integrated circuit with multiple electronic components (e.g., transistors, resistors, capacitors or combinations thereof). Aspects of the present disclosure can be employed in other types or forms of packaged electronic devices, for example, which include only a single electronic component. Bulk acoustic wave (BAW) devices can be used in sensor applications. Sensing performance can be by isolating a sensor die within an integrated circuit (IC) package from mechanical stress, shock and/or vibration incident on the outer surfaces of the packaged IC. The example electronic device 100 includes a stress absorbing material that structurally isolates an internal die from external mechanical stress, such as shock and vibration. In addition, the device 100 includes two molded package structures to mitigate glob top material bleed out and associated delamination of package materials and leads, to help avoid or mitigate wire bond integrity problems even where the device 100 is subjected to reliability testing or other thermal cycling. In certain examples, a surface of a portion of an upper package structure is separated (e.g., delaminated) from a portion of the stress absorbing material to enhance the stress isolation of the protected internal die. The dual package structures can be used alone or in combination with a PI (polyimide) ring on a lower die to further combat isolation material bleed out.

The example electronic device 100 of FIG. 1 includes structures fabricated using a starting lead frame. The lead frame and the starting portions thereof can be any suitable material, such as copper or a material that includes copper. Various copper alloy materials can be used, such as EFTEC64T and CDA194. The electronic device 100 includes a rectangular (e.g., square) die attach pad 102 with four sides. In the example of FIG. 1, the lead frame and the die attach pad 102 thereof include half etched recesses or steps, although not a requirement of all possible implementations. A first semiconductor die 104 is mounted to a die support portion of the die attach pad 102, for example, using epoxy. The first semiconductor die 104 includes one or more electronic components (not shown), such as transistors, resistors, capacitors, etc. The first semiconductor die 104 has a first (e.g., bottom) side mounted to the die attach pad 102, and a second (e.g., top) side with conductive bond pads electrically connected to a circuit or component of the semiconductor die 104. The electronic device 100 in FIG. 1 includes a polyimide (e.g., PI) layer 105 that extends on the upper or second side of the first semiconductor die 104.

The example electronic device 100 of FIG. 1 is a four-sided flat no-leads package (e.g., a quad-flat no-leads (QFN) package). The concepts of the present disclosure can be used in other types and forms of electronic device packages, such as dual-flat no-leads (DFN) packages, micro lead frame (MLF) packages, small outline no leads (SON) packages, or other surface mount and non-surface mount electronic device package types and/or forms. In the QFN example of FIG. 1, the electronic device 100 includes leads 106 that are outwardly spaced apart from respective ones of the four sides of the die attach pad 102. The leads 106 have externally accessible portions for soldering to a host printed circuit board (not shown). Other implementations are possible in which the leads 106 are provided on only a single side of the electronic device 100, or on a different number of sides of the electronic device 100. The electronic device 100 also includes one or more first bond wires 108. Individual ones of the first bond wires 108 are connected between a respective one of the conductive bond pads of the first semiconductor die 104 and a respective lead 106.

The electronic device 100 includes a second semiconductor die 110 mounted to the top or second side of the first semiconductor die 104, for example, using epoxy (not shown). The second semiconductor die 110 includes one or more electronic components (not shown), such as transistors, resistors, capacitors, etc. In one example, the second semiconductor die 110 includes a sensor element or a sensor circuit to sense one or more conditions. In the example electronic device 100, the polyimide layer 105 is spaced apart from, and encircles, the second semiconductor die 110. In other examples, the polyimide layer 105 can be omitted. In another example, more than one polyimide layer 105 is formed on the second side of the first semiconductor die 104, for example, concentric ring shapes that encircle the second semiconductor die 110. The polyimide layer 105 is an electrically insulating lightweight organic material formed as a polymer of imide monomers and provides high heat-resistance and flexibility to prevent or reduce lateral bleed out of stress absorbing material during fabrication. The second semiconductor die 110 includes a first (e.g., bottom) side mounted to the second side of the first semiconductor die 104. The second semiconductor die 110 also includes a second (e.g., top) side with one or more conductive bond pads electrically connected to a circuit or component of the second semiconductor die 110. A second bond wire 112 is connected between a corresponding conductive bond pad of the first semiconductor die 104 and a respective conductive bond pad of the second semiconductor die 110.

The electronic device 100 also includes a stress absorbing structure 114 and a package structure 120. The package structure 120 includes a first package structure 121 and a second package structure 122, joined with one another along a join line 124. The stress absorbing structure 114 extends on the second semiconductor die 110 and on a portion of the second side of the first semiconductor die 104. In one example, the stress absorbing structure 114 is a flexible material that isolates all or a portion of the second semiconductor die 110 from external mechanical stress (e.g., shock and/or vibration) incident on the outer surfaces of the packaged electronic device 100. One suitable example material for the stress absorbing structure 114 is an epoxy material. In one example, the stress absorbing structure 114 includes a thermally cured epoxy material. In one example, the stress absorbing structure 114 is a low viscosity epoxy encapsulant, such as an epoxy laminate to help control bleed out during deposition. The stress absorbing structure 114 in one example is a low-stress, low thixotropic epoxy with a low coefficient of thermal expansion following any curing operation during fabrication.

The stress absorbing structure 114 functions as glob top to encapsulate a portion of the top side of the first semiconductor die 104, as well as the top and side portions of the second semiconductor die 110 and the second bond wire 112 as shown in FIG. 1. In one example, the stress absorbing structure 114 extends at least partially onto the included polyimide layer 105. In another implementation, the polyimide ring layer 105 is spaced apart from and encircles the lateral sides of the stress absorbing structure 114. In another possible implementation, the stress absorbing structure 114 extends over the top and both sides of the polyimide layer 105. In another implementation, the stress absorbing structure 114 extends over only a portion of the second bond wire 112, and the bond wire 112 extends at least partially through the first package structure 121.

The first package structure 121 in FIG. 1 extends on portions of the die attach pad 102, the lead 106, and the first semiconductor die 104. The first package structure 121 also extends within the lateral spaces between the die attach pad 102 and the illustrated leads 106, and also fills undercuts in the die attach pad 102 and leads 106 to provide locking features between the first package structure 121 and the metal portions 102 and 106 of the starting lead frame, to prevent or mitigate delamination between these metal features and the first package structure 121. In addition, the first package structure 121 extends around at least a first (e.g., lower) portion of the stress absorbing structure 114. In this example, the second package structure 122 encloses a second (e.g., upper) portion of the stress absorbing structure 114 and extends on a first (e.g., top) side of the first package structure 121 to form the join line 124 along an outer surface of the electronic device 100 at the interface between the first and second package structures 121 and 122. In one example, the respective first and second package structures 121 and 122 are or include a molded compound material, such as a molded plastic or other moldable electrical insulator material. In this example, the first and second package structures 121 and 122 are separately molded using two different molding operations, and the join line 124 can extend slightly outward from the sides of the finished package structure 120, or can be generally flush with the sides of the finished package structure 120, and/or can be slightly indented into the sides of the finished package structure 120, or combinations thereof. The join line 124 in one example is a shape that results from the relative positions of first and second molds used in forming the respective first and second package structures 121 and 122, and may include outwardly and inwardly extending portions, flush portions, or combinations thereof.

As further shown in the example of FIG. 1, a portion of the upper surface of the stress absorbing structure 114 is spaced apart (e.g., delaminated) from a corresponding surface of the second package structure 122. FIG. 1 shows a delamination gap distance 126 between the top portion of the stress absorbing structure 114 and a lower surface of the second package structure 122. In one example, the delamination occurs during thermal processing of the electronic device 100, for example, during fabrication processing and/or post fabrication testing. In operation, the spaced relationship facilitates mechanical isolation of the protected second semiconductor die 110 from the package structure 122 facilitate reduced mechanical stress to the protected second semiconductor die 110. In practice, the stress absorbing structure 114 can be fabricated by any variety of techniques. The illustrated example includes forming a cavity or opening within the first package structure 121, for example, by corresponding design of an upper portion of a first mold (not shown), and the stress absorbing structure 114 is created by depositing glob top material (e.g., thermally curable epoxy) within the opening in the first package structure 121. This technique and the corresponding structure mitigate or avoid bleed out of the stress absorbing structure material 114 outward along the X direction in FIG. 1. Reducing or avoiding stress absorbing structure bleed out, in turn, mitigates subsequent delamination of the molded package material 121 from the surfaces of the first semiconductor die 104, the die attach pad 102, and the leads 106, and thus facilitates stitch bond integrity in the package electronic device 100.

Figure 2:
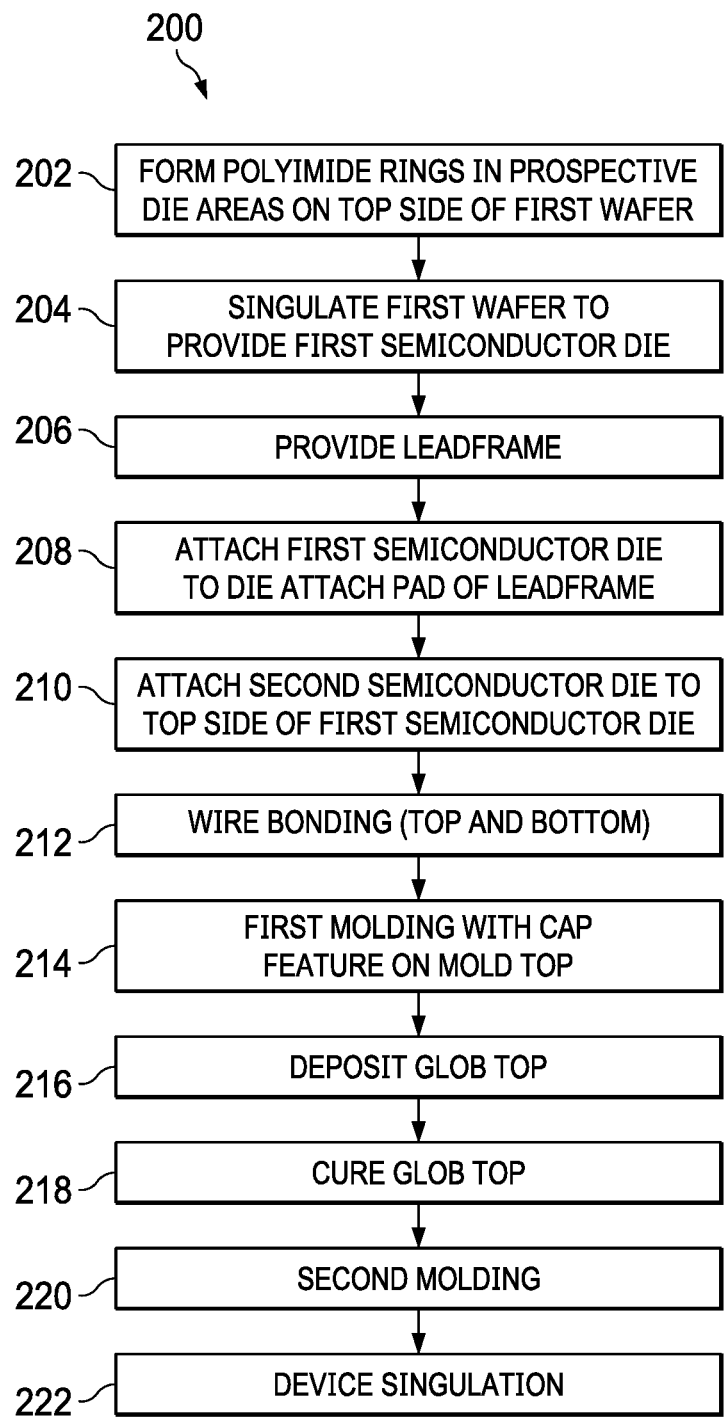
FIG. 2 is a flow diagram of a method to fabricate a packaged electronic device.

Referring also to FIGS. 2-15, FIG. 2 shows an example method 200 to fabricate a packaged electronic device and FIGS. 3-15 show the example electronic device 100 of FIG. 1 at various stages of fabrication according to the method 200 of FIG. 2. The method 200 begins with a processed first wafer (not shown) that includes multiple prospective semiconductor die areas that each include circuitry corresponding to the first semiconductor die 104 described above in connection with FIG. 1. The beginning processed wafer (e.g., silicon) includes one or more electronic components previously fabricated in each of a number of different prospective die locations, along with a metallization structure providing one or more conductive bond pads at an exposed top side of the individual die areas. At 202 in FIG. 2 one or more polyimide ring layers are formed in prospective die areas on the top side of the first wafer. In other implementations, the polyimide layer formation at 202 can be omitted. At 204, the starting first wafer is separated or singulated (e.g., by sawing) to provide two or more semiconductor dies (e.g., the first semiconductor die 104 in FIG. 1 above).

Figure 3:
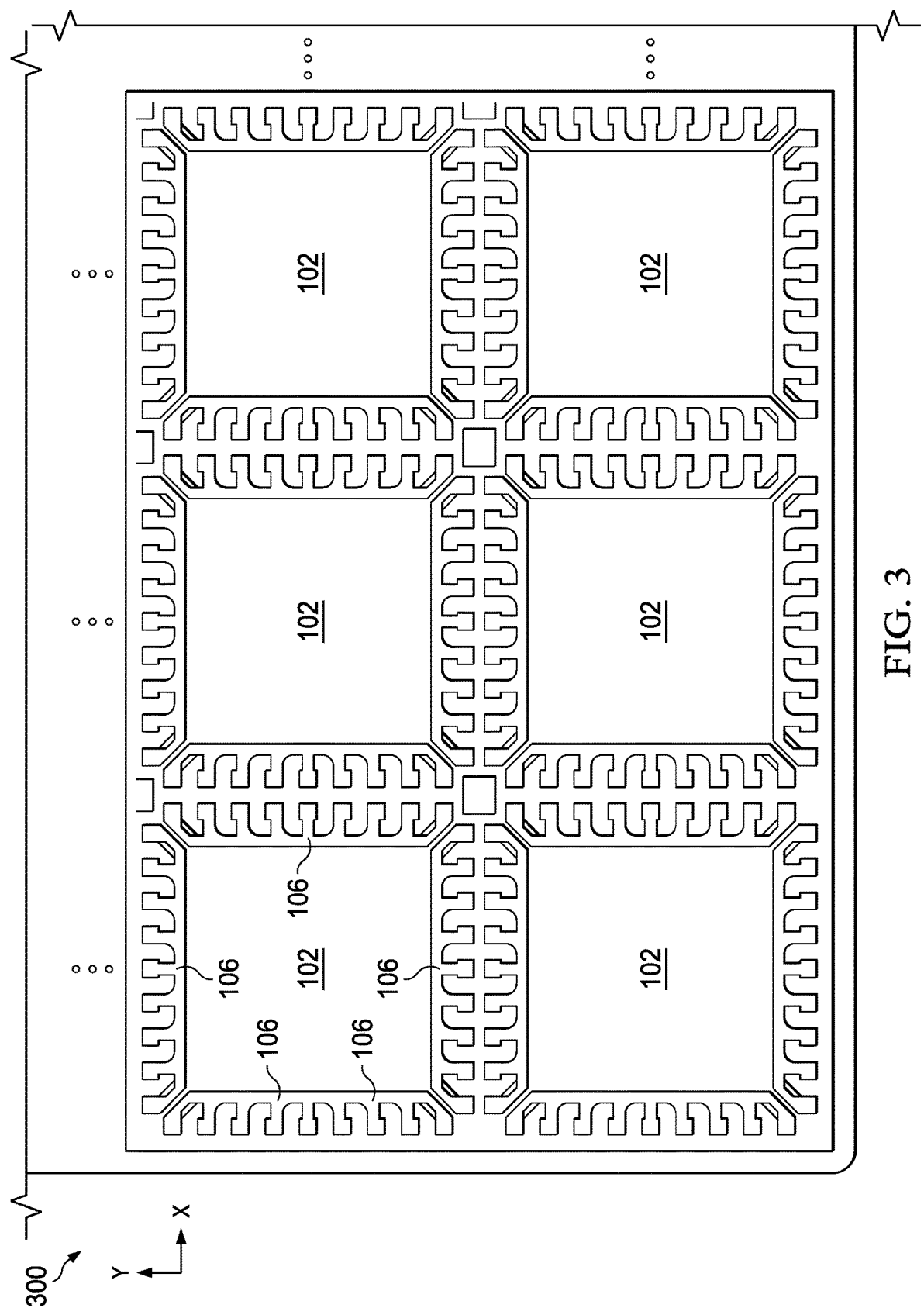
FIG. 3 is a partial top plan view of a lead frame.

The method 200 further includes providing a starting lead frame at 206. FIG. 3 shows one example of a portion of a starting lead frame 300. The lead frame 300 includes multiple sections that individually correspond to a respective final device after fabrication and package separation, four of which are shown in FIG. 3 in a corner portion of a lead frame panel. Each of the panel sections in this example includes a rectangular die attach pad 102 with leads 106 spaced from the four sides thereof along the X and Y directions. The lead frame 300 can be fabricated using a variety of different lead frame manufacturing processes and techniques. In one example, the lead frame 300 is provided at 202 as a generally flat or planar structure. In another example, the starting lead frame 300 includes one or more recessed portions (e.g., undercut portions of the die attach pad 102 and the leads 106 in FIG. 1 above) to mitigate or avoid delamination from subsequently formed molded package material. In certain implementations, the lead frame 300 includes one or more plated surfaces, and may also or alternatively include one or more roughened surfaces (not shown). Certain implementations can also include one or more dimples or other surface features to facilitate adherence to molded materials to thereby mitigate or avoid delamination.

The method 200 also includes performing a first die attach process at 208 in FIG. 2. FIG. 4 shows one example, in which a die attach process 400 is performed that attaches the first semiconductor die 104 to the die attach pad 102 of the lead frame 300. The die attach process 400 in one example includes initial dispensing or other deposition of epoxy material (not shown) in the die support portions of the individual die pads 102, followed by placement (e.g., automatic pick and place robotic processing) to place respective singulated first semiconductor dies 104 on the epoxy in the associated die attach pad location, as shown in FIG. 4. The example die attach process 400 also includes subsequent epoxy curing steps, for example, using thermal annealing or other suitable process. In one example, the respective semiconductor dies 104 include one or more conductive thermal pads that are soldered to the conductive die attach pads 102, although not required in all possible implementations.

A second die attach process is performed at 210 in FIG. 2 to attach the second semiconductor die 110 to the top side of the first semiconductor die 104. FIG. 5 shows an example, in which a second die attach process 500 is performed that attaches the second semiconductor die 110 to the top side of the first semiconductor die 104. The second die attach process 500 in one example includes initial dispensing or other deposition of epoxy material (not shown) in a predetermined portion of the top side of the first semiconductor die 104, and automatic placement of the second semiconductor die 110 on the deposited epoxy, as well as any epoxy curing.

Figure 6:
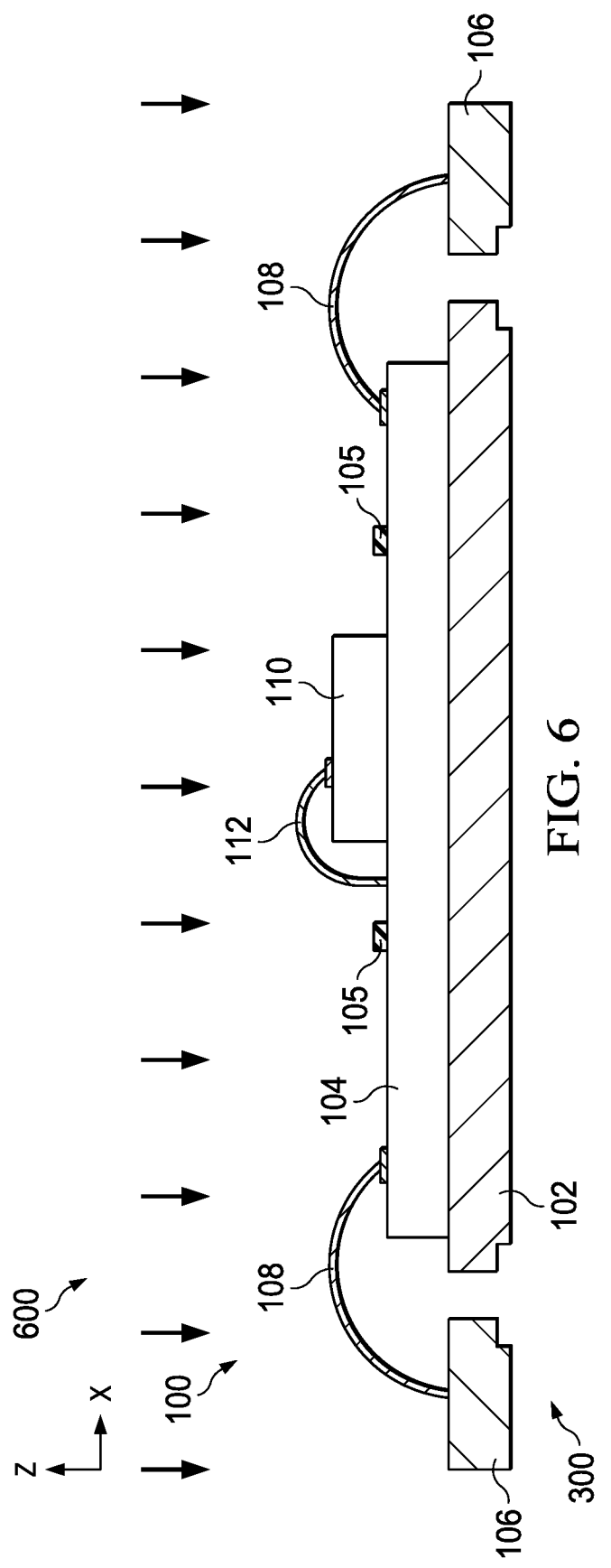
FIG. 6 is a partial sectional side elevation view of the lead frame of FIGS. 3-5 undergoing a wire bonding process.

The method 200 continues at 212 with wire bonding. FIG. 6 shows a portion of the lead frame panel undergoing a wire bonding process 600. In this example, the wire bonding process 600 attaches or otherwise connects the first bond wires 108 between respective conductive bond pads of the first semiconductor die 104 to a respective lead 106 of the lead frame 300. In addition, the wire bonding process 500 connects the example second bond wire 112 between a second conductive bond pad of the first semiconductor die 104 and a conductive bond pad of the second semiconductor die 110. The first and second bond wires 108 and 112 can be the same or different. In addition, the same or separate wire bonding steps can be used for the first and second bond wires 108 and 112. In one example, the wire bonding process 600 uses gold (Au), copper (Cu) or palladium coated copper (PCC) wires of any suitable diameter(s), such as 0.8 mils, 0.96 mils, 1.3 mils or 2.0 mils in a three step process that includes first bond or ball formation, loop formation, and second bond or stitch formation using a capillary bonding tool that holds and controls the bond wire 108, 112 during the wire bonding process 600. In another example, wedge bonding can be used.

The method 200 in FIG. 2 thereafter continues at 214-220 with an included method to fabricate a stress absorbing glob top structure (e.g., including the stress absorbing structure 114 and the first and second package structures 121 and 122, respectively). The resulting structure provides chemical stress isolation/protection for the second semiconductor die 110, for example, to protect sensor circuitry within the die 110. This example includes multistep molding operations, with stress isolation material deposition and optional curing between first and second moldings. In this manner, laterally outward lead out of the stress absorbing structure 114 is reduced or prevented.

Figure 7:
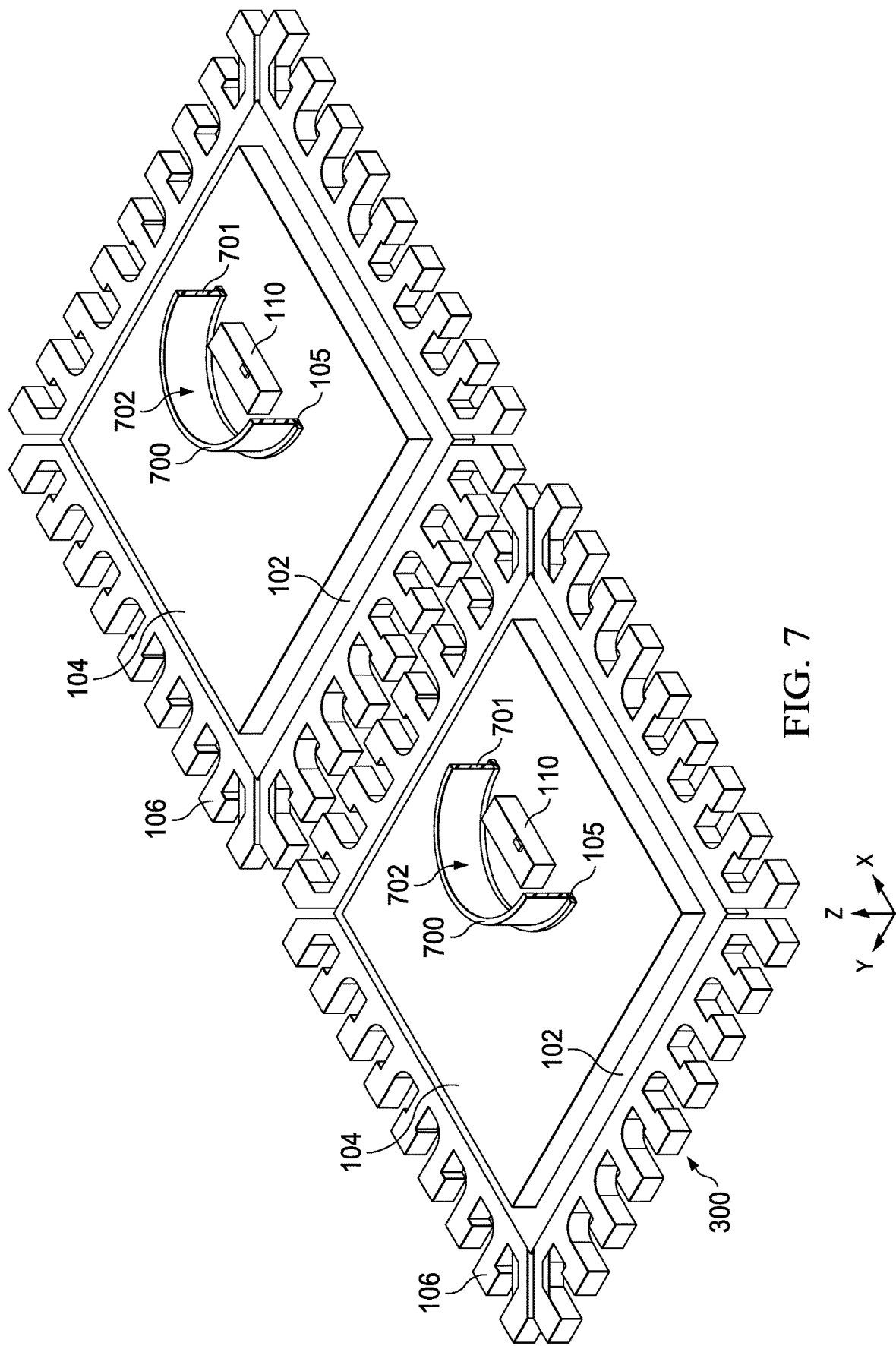
FIG. 7 is a partial perspective view of the lead frame of FIGS. 3-6 that shows a portion of a first mold with a cavity to create an opening.
Figure 8:
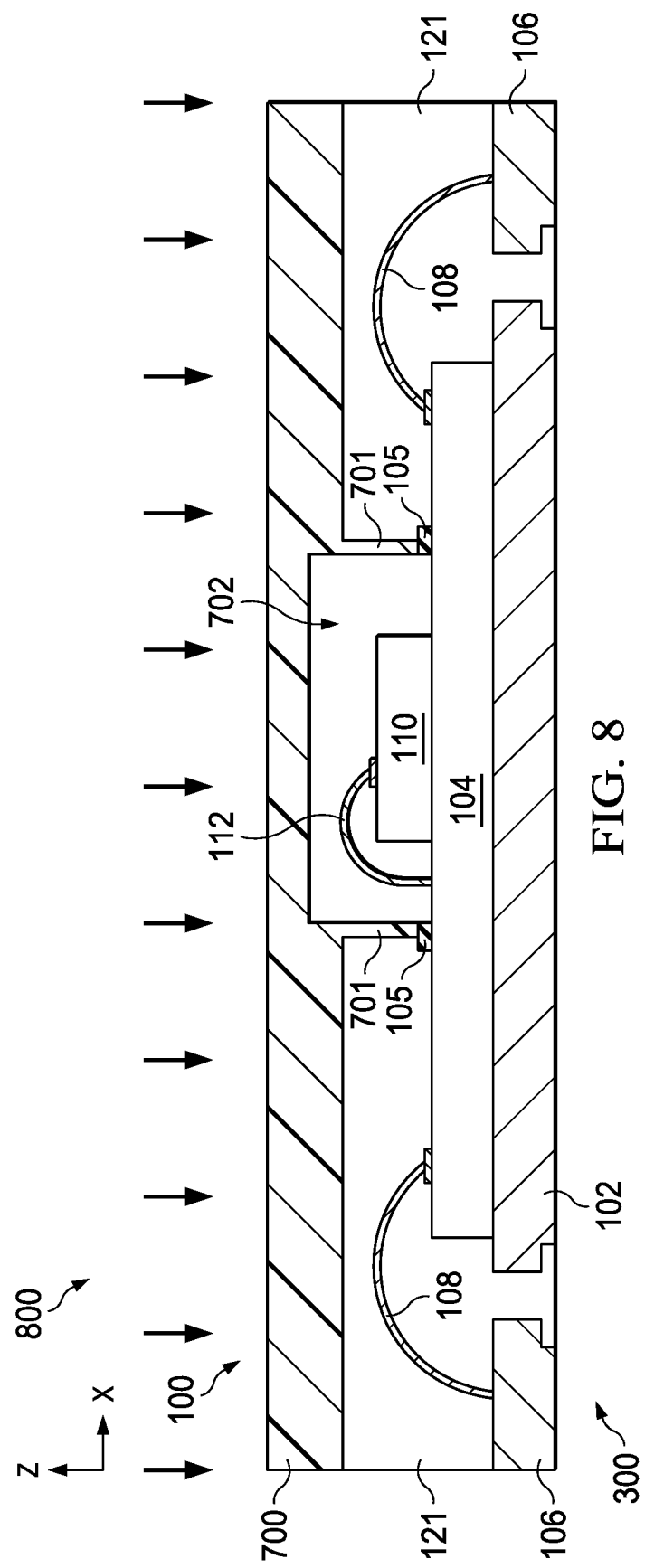
FIG. 8 is a partial sectional side elevation view of the lead frame of FIGS. 3-7 undergoing a first molding process to create a first package structure with an opening corresponding to the cavity of the first mold of FIG. 7.
Figure 9:
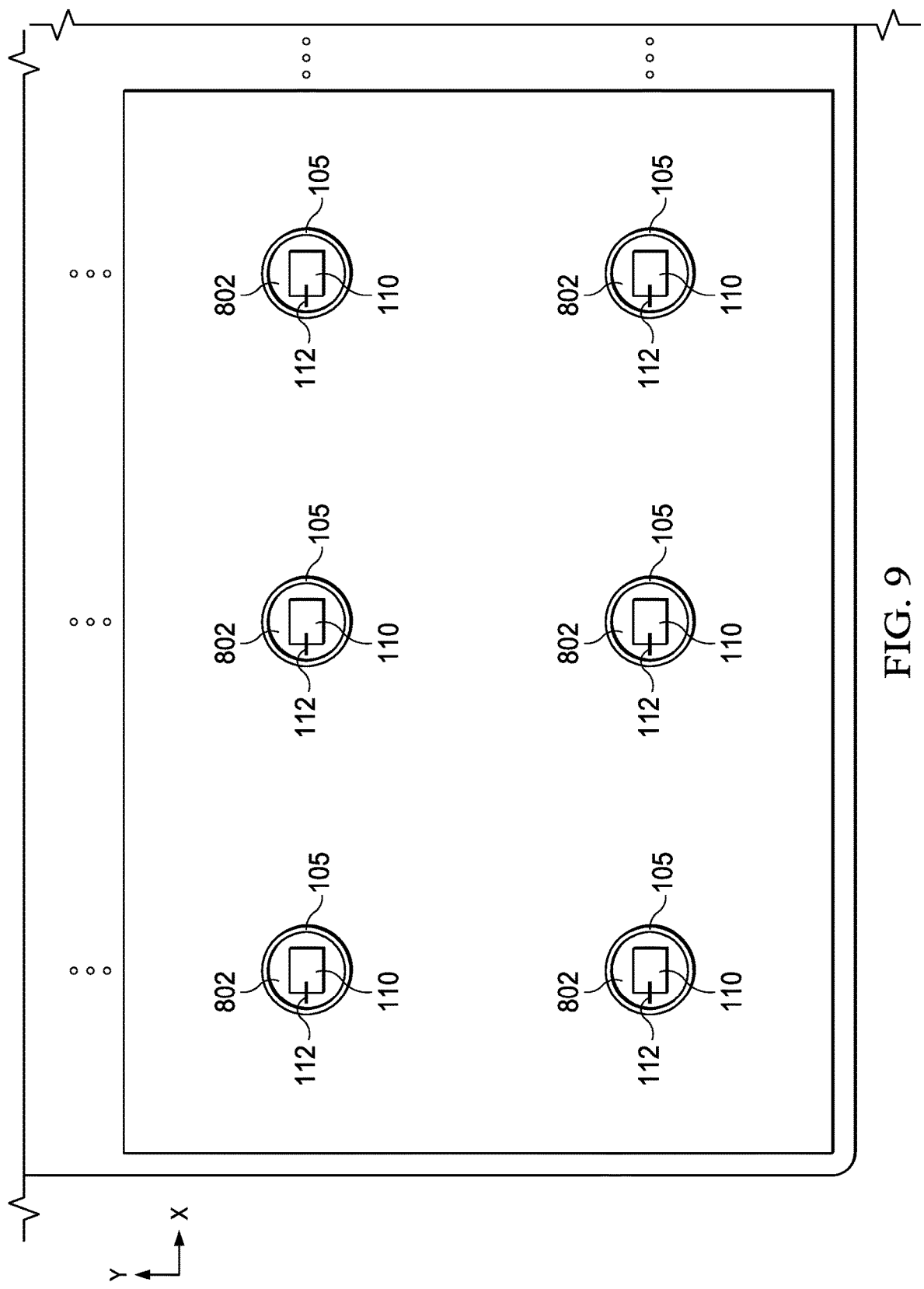
FIG. 9 is a partial top plan view of the lead frame of FIGS. 3-8 after the first molding process.

The method 200 includes a first molding process at 214 in FIG. 2 to form the first package structure 121. FIGS. 7-9 show one example of the first molding processing at 214 to form the first package structure 121. FIG. 7 shows a partial perspective view of two sections of the lead frame panel 300 with the semiconductor dies 104 and 110 attached (bond wires not shown). A top portion of a mold 700 is positioned over the lead frame panel 300. The mold 700 includes cylindrical extensions 701 that face downward and define respective cavities 702 in the mold top. FIG. 8 shows a side view of one section of the lead frame 300 undergoing a first molding process 800 with the mold 700 installed. During the first molding process 800, the cavities 702 surround the second semiconductor die 110 and the second bond wire 112. In one example, the first molding process 800 includes placing the top of the first mold 700 over the lead frame 300 with the cavity 700 surrounding the second semiconductor die 110 and a portion of the second bond wire 112 (e.g., FIG. 7), followed by injecting the first molding material 121 into the first mold 700, and removing the first mold 700 from the lead frame 300. The molding process 800 in one example creates the first package structure 121 as shown in FIG. 8. FIG. 9 shows a top view of six example sections of the lead frame 300 after the first molding process 800 with the mold 700 removed. As shown in FIG. 8 and the top view in FIG. 9, the first package structure 121 extends on portions of the die attach pad 102, the lead 106, and the first semiconductor die 104, as well as within the lateral spaces between the die attach pad 102 and the leads 106 to fill undercuts in the die attach pad 102 and leads 106. As shown in FIG. 9, moreover, the first package structure 121 has respective openings 802 that correspond to the cavities 702 of the first mold of FIGS. 7 and 8.

Figure 10:
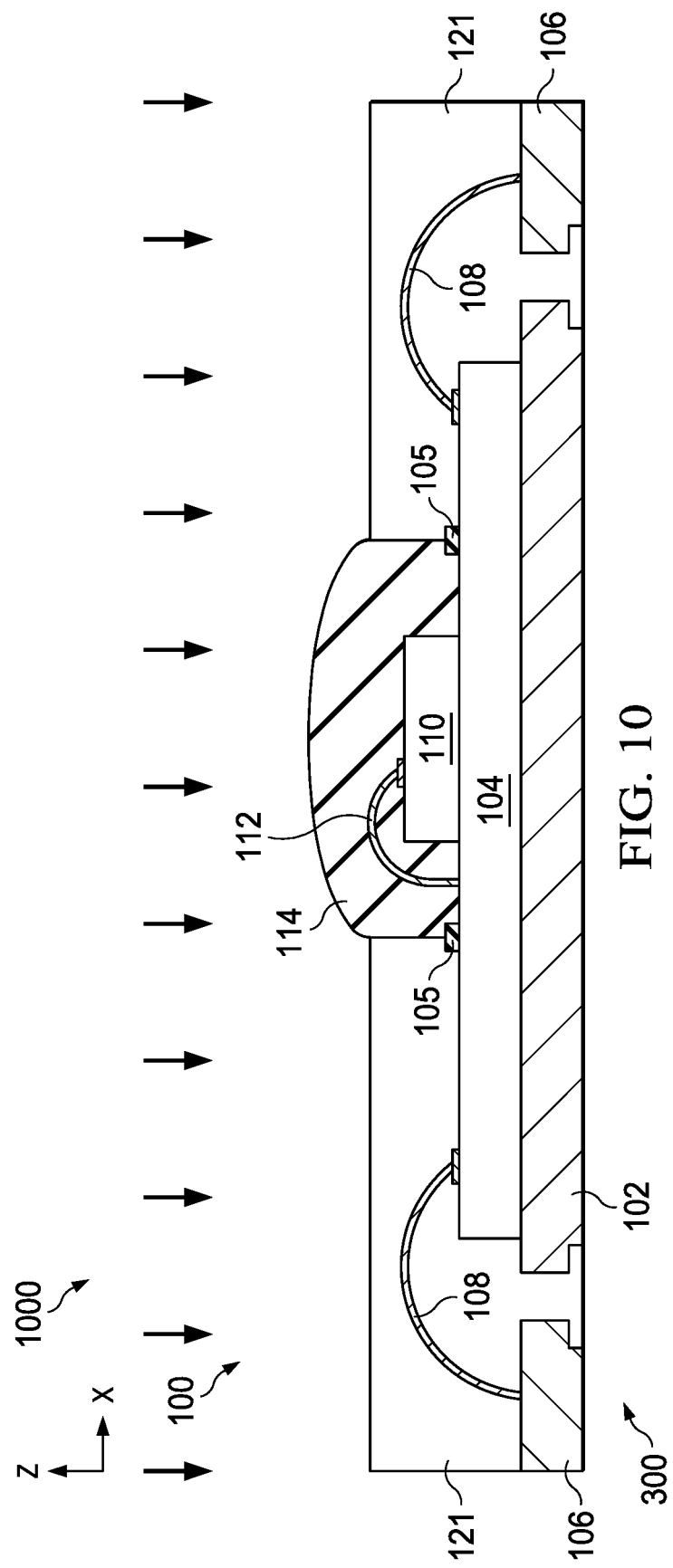
FIG. 10 is a partial sectional side elevation view of the lead frame of FIGS. 3-9 undergoing a deposition process to form a glob top material in the opening of the first package structure.
Figure 11:
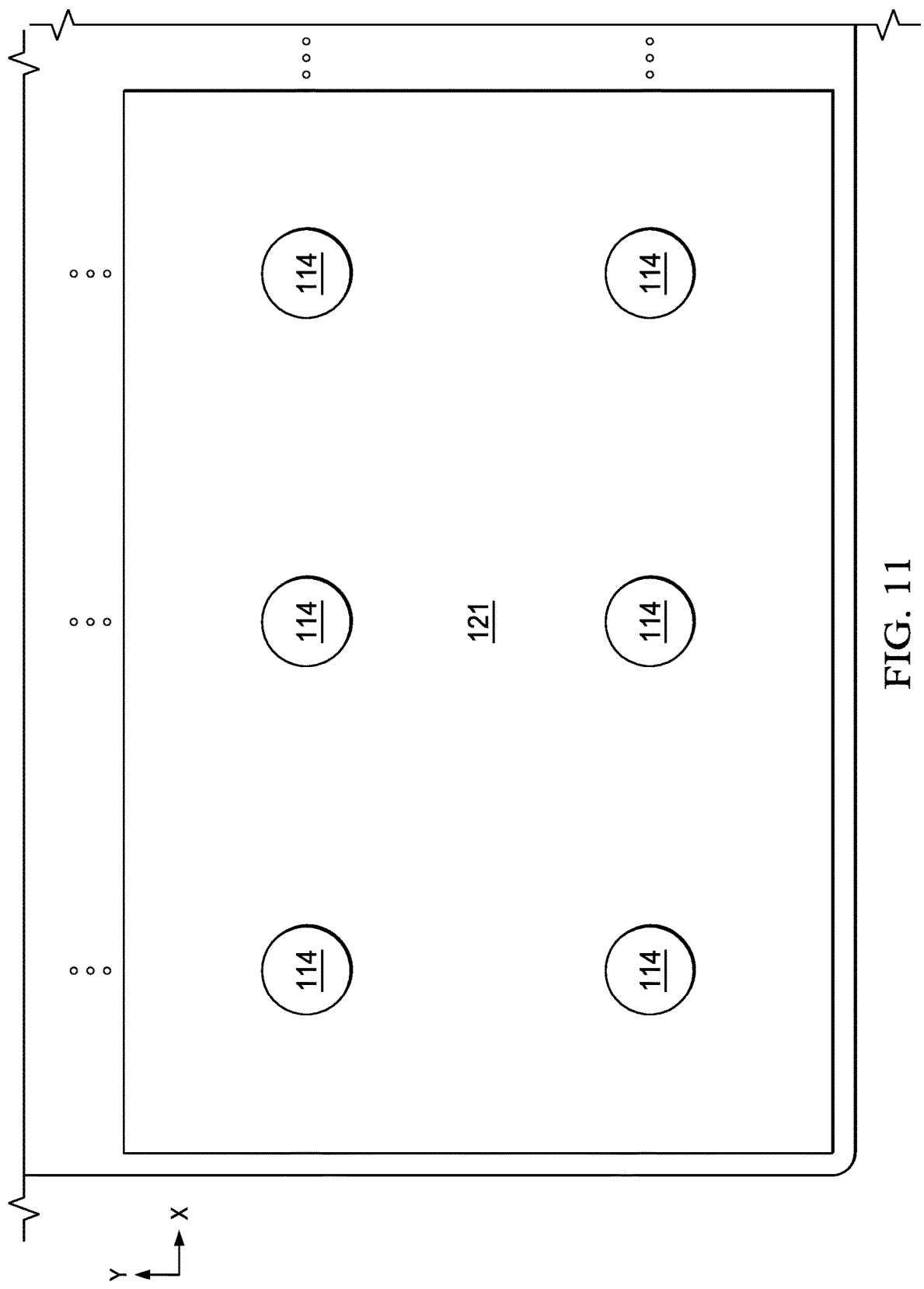
FIG. 11 is a partial top plan view of the lead frame of FIGS. 3-10 after the deposition process.
Figure 12:
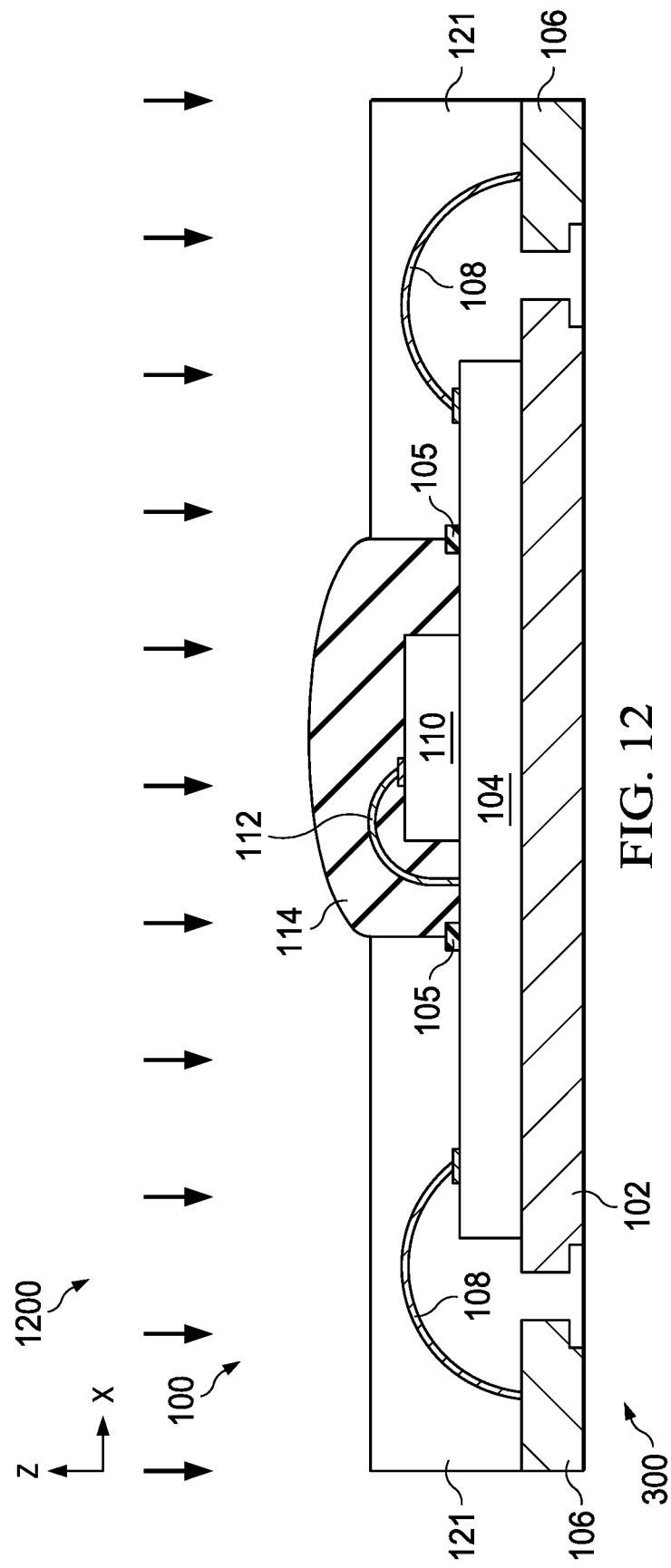
FIG. 12 is a partial sectional side elevation view of the lead frame of FIGS. 3-11 undergoing a thermal process to cure the deposited glob top material.

The method 200 continues at 216 in FIG. 2 to deposit the stress absorbing material 114 in the opening of the first package structure 121. FIG. 10 shows one example of a deposition process 1000 that deposits an epoxy or other stress absorbing material 114 in the opening 802 of the first package structure 121. In this example, the deposition process 1000 covers the exposed top and side portions of the second semiconductor die 110, as well as the second bond wire 112. In one example, the deposition process 1000 is a jet printing process that deposits the stress absorbing material 114 in the opening 802. FIG. 11 shows a partial top view after the deposition process 1000 of FIG. 10 is performed, in which the deposited stress absorbing material 114 fills the opening in the first package structure 121. In the example of FIGS. 10 and 11, the stress absorbing material 114 fills the opening and extends above a top surface of the first package structure 121, although not a strict requirement of all possible implementations. In one example, the method 200 also includes a curing process at 218 in FIG. 2 for curing the deposited stress absorbing material 114. Any suitable process can be used at 218 that cures the deposited stress absorbing material 114. FIG. 12 shows one example, in which a thermal curing process 1200 is performed that cures the stress absorbing material 114 in the opening 802 of the first package structure 121. In another example, an ultraviolet (UV) process is used, for example, to cure a UV-curable stress absorbing material 114. In other examples, no curing process is required.

Figure 13:
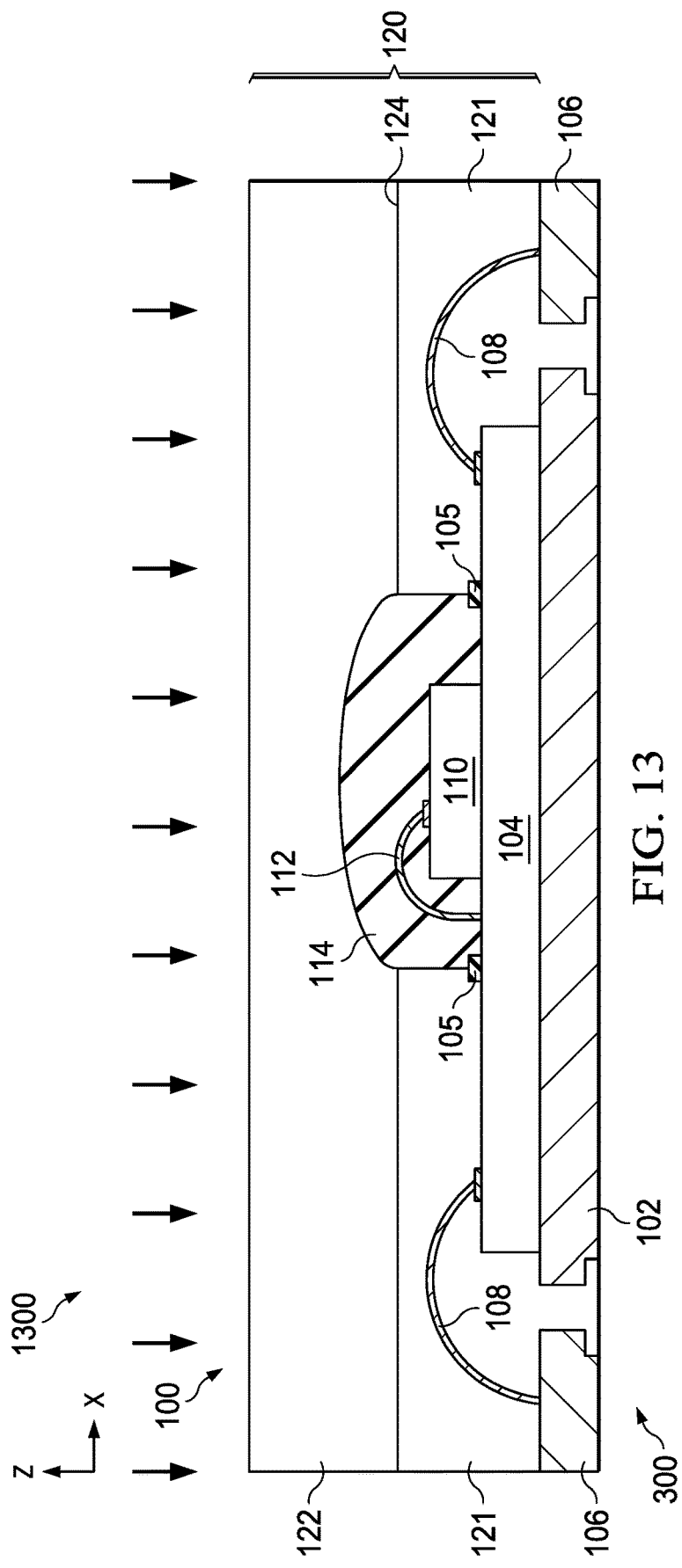
FIG. 13 is a partial sectional side elevation view of the lead frame of FIGS. 3-12 undergoing a second molding process to create a second package structure.
Figure 14:
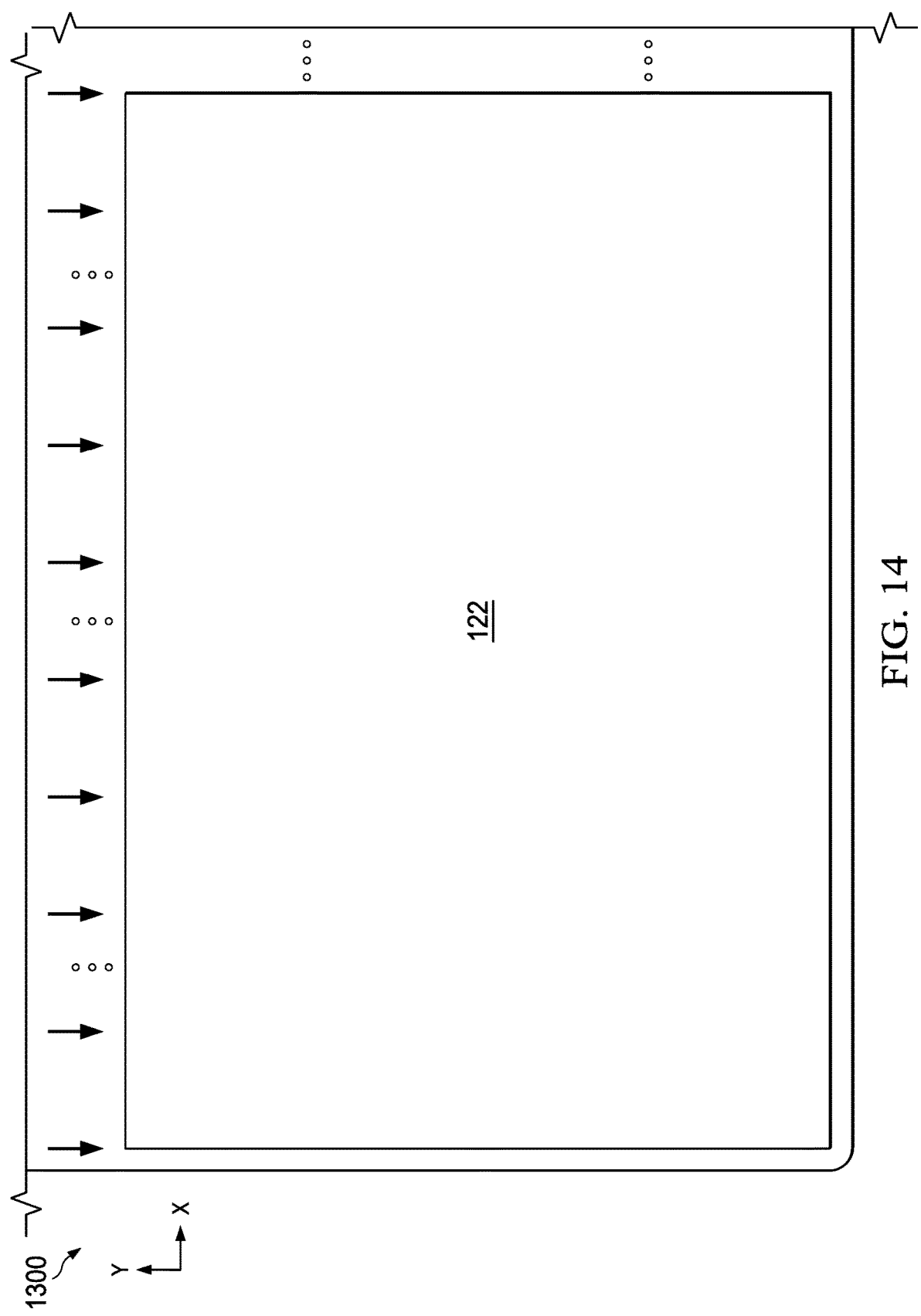
FIG. 14 is a partial top plan view of the lead frame of FIGS. 3-13 after the second molding process.

At 220 in FIG. 2, a second molding process is used to create the second package structure 122. FIGS. 13 and 14 show sectional side and top views of one example, in which a second molding process 1300 is performed that encloses a portion of the stress absorbing structure 114 in the second package structure 122 that extends on the top side of the first package structure 121. As seen in FIGS. 1 and 13, the formation of the second package structure 122 over the top side of the first package structure 121 leaves a join line 124 at the interface of the package structures 121 and 122.

Figure 15:
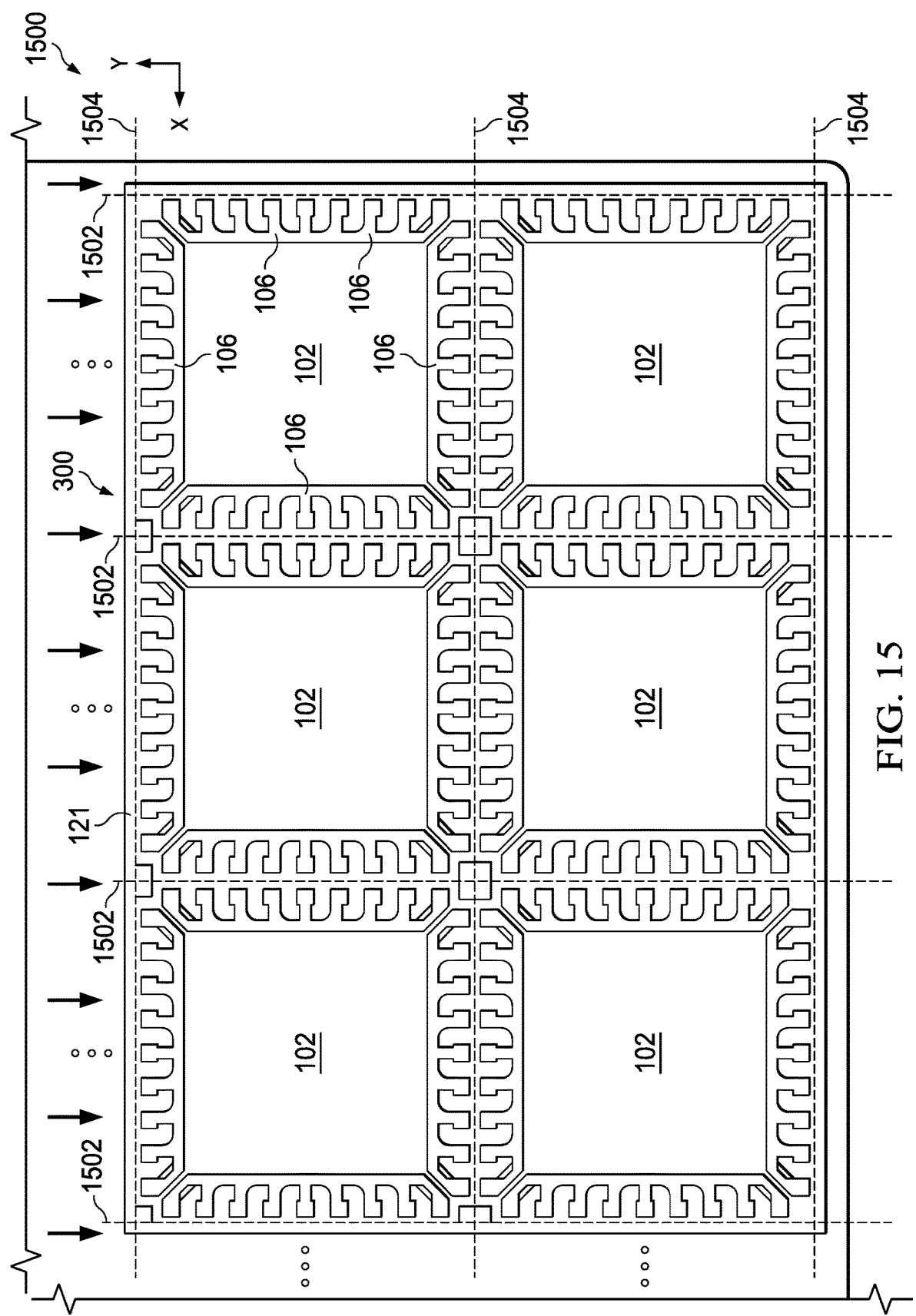
FIG. 15 is a partial bottom plan view of the lead frame of FIGS. 3-14 undergoing a package singulation process.

At 222 in FIG. 2, a package singulation process is performed to separate individual electronic devices 100 from one another and to expose side portions of the leads 106. FIG. 15 shows a bottom view of the lead frame panel undergoing a package singulation saw process 1500 that cuts through the molded package structures 121 an 122 and separates respective ones of the leads 106 from one another between the individual die sections of the lead frame panel along saw path lines 1502 in the Y direction, and then along saw path lines 1504 in the X direction to create the package sides and to expose the laterally outward portions of the leads 106. In one example, the fabrication process also includes automated visual inspection followed by packing and shipment (not shown).

The disclosed electronic device 100 and the fabrication method 200 help ensure that a glob top material or other stress absorbing structure 114 can be deposited in a controlled manner to mitigate bleed out. The opening 802 in the first package structure 121 contains the deposited stress absorbing structure 114 to provide controlled delamination thereof from the second package structure 122 while preventing or mitigating delamination outside the PI ring 105.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A method, comprising:
   performing a first die attach process that attaches a first side of a first semiconductor die to a die attach pad of a lead frame;
   performing a second die attach process that attaches a second semiconductor die to a second side of the first semiconductor die;
   performing a wire bonding process that connects a first bond wire between a first conductive bond pad of the first semiconductor die to a lead of the lead frame, the wire bonding process connecting a second bond wire between a second conductive bond pad of the first semiconductor die and a conductive bond pad of the second semiconductor die;
   performing a first molding process that encloses a portion of the die attach pad, a portion of the first semiconductor die, a portion of the lead, and the first bond wire in a first package structure with an opening that exposes a portion of the second semiconductor die;
   performing a deposition process that deposits a stress absorbing material in the opening of the first package structure to cover the portion of the second semiconductor die; and
   performing a second molding process that encloses a portion of the stress absorbing structure in a second package structure that extends on a side of the first package structure.

2. The method of claim 1, further comprising:
   after performing the deposition process, and before performing the second molding process, performing a curing process that cures the stress absorbing material in the opening of the first package structure.

3. The method of claim 2, wherein the curing process is a thermal process.

4. The method of claim 2, further comprising:
   after performing the second molding process, performing a singulation process that separates packaged electronic devices from one another.

5. The method of claim 1, wherein performing the first molding process comprises:
   placing a first mold over the lead frame, the first mold including a cavity that surrounds the second semiconductor die and a portion of the second bond wire;
   injecting a first molding material into the first mold; and
   removing the first mold from the lead frame.

6. The method of claim 1, further comprising:
   after performing the second molding process, performing a singulation process that separates packaged electronic devices from one another, and that exposes a portion of the lead along a side of the first package structure.

7. The method of claim 1, further comprising:
   before performing the first die attach process, forming a polyimide layer on the second side of the first semiconductor die.

8. The method of claim 1, wherein the deposition process is a jet printing process that deposits the stress absorbing material in the opening of the first package structure to cover the portion of the second semiconductor die.

9. A method to fabricate a stress absorbing glob top structure in an electronic device, the method comprising:
   performing a first molding process that encloses a portion of a first semiconductor die in a first package structure with an opening that exposes a portion of a second semiconductor die that is mounted to the first semiconductor die;
   performing a deposition process that deposits a stress absorbing material in the opening of the first package structure to cover the portion of the second semiconductor die; and
   performing a second molding process that encloses a portion of the stress absorbing structure in a second package structure that extends on a side of the first package structure.

10. The method of claim 9, further comprising:
    after performing the deposition process, and before performing the second molding process, performing a curing process that cures the stress absorbing material in the opening of the first package structure.

11. The method of claim 9, wherein performing the first molding process comprises:
    placing a first mold over a lead frame, the first mold including a cavity that surrounds the second semiconductor die;
    injecting a first molding material into the first mold; and
    removing the first mold from the lead frame.

12. The method of claim 9, wherein the deposition process is a jet printing process that deposits the stress absorbing material in the opening of the first package structure to cover the portion of the second semiconductor die.

13. A method, comprising:
    performing a first die attach process that attaches a first side of a first semiconductor die to a die attach pad of a lead frame;
    performing a second die attach process that attaches a second semiconductor die to a second side of the first semiconductor die;
    performing a first molding process that encloses a portion of the die attach pad, a portion of the first semiconductor die in a first package structure with an opening that exposes a portion of the second semiconductor die;

performing a deposition process that deposits a stress absorbing material in the opening of the first package structure to cover the portion of the second semiconductor die; and performing a second molding process that encloses a portion of the stress absorbing structure in a second package structure that extends on a side of the first package structure.

14. The method of claim 13, further comprising:

after performing the deposition process, and before performing the second molding process, performing a curing process that cures the stress absorbing material in the opening of the first package structure.

15. The method of claim 14, wherein the curing process is a thermal process.

16. The method of claim 14, further comprising:

after performing the second molding process, performing a singulation process that separates packaged electronic devices from one another.

17. The method of claim 13, wherein performing the first molding process comprises:

placing a first mold over the lead frame, the first mold including a cavity that surrounds the second semiconductor die and a portion of the second bond wire;

injecting a first molding material into the first mold; and removing the first mold from the lead frame.

18. The method of claim 13, further comprising:

after performing the second molding process, performing a singulation process that separates packaged electronic devices from one another, and that exposes a portion of the lead along a side of the first package structure.

19. The method of claim 13, further comprising:

before performing the first die attach process, forming a polyimide layer on the second side of the first semiconductor die.

20. The method of claim 13, wherein the deposition process is a jet printing process that deposits the stress absorbing material in the opening of the first package structure to cover the portion of the second semiconductor die.

21. The method of claim 1, wherein the second molding process encloses a top side of the first package structure.

22. The method of claim 9, wherein the second molding process encloses a top side of the first package structure.

23. The method of claim 13, wherein the second molding process encloses a top side of the first package structure.

* * * * *